United States Patent
Yang et al.

(10) Patent No.: US 12,245,516 B2
(45) Date of Patent: *Mar. 4, 2025

(54) SELF-ALIGNED ENCAPSULATION HARD MASK TO SEPARATE PHYSICALLY UNDER-ETCHED MTJ CELLS TO REDUCE CONDUCTIVE RE-DEPOSITION

(71) Applicant: Taiwan Semiconductor Manufacturing Company, Ltd., Hsin-Chu (TW)

(72) Inventors: Yi Yang, Fremont, CA (US); Dongna Shen, San Jose, CA (US); Vignesh Sundar, Fremont, CA (US); Yu-Jen Wang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/232,027

(22) Filed: Aug. 9, 2023

(65) Prior Publication Data
US 2023/0389435 A1    Nov. 30, 2023

Related U.S. Application Data

(63) Continuation of application No. 17/816,035, filed on Jul. 29, 2022, now Pat. No. 11,818,961, which is a (Continued)

(51) Int. Cl.
*H10N 50/01*    (2023.01)
*H01F 10/32*    (2006.01)
(Continued)

(52) U.S. Cl.
CPC ......... *H10N 50/01* (2023.02); *H01F 10/3254* (2013.01); *H01F 41/34* (2013.01);
(Continued)

(58) Field of Classification Search
CPC ........... H01L 21/28141; H01L 29/0653; H01L 29/6653; H01L 29/66553; H01L 29/6656;
(Continued)

(56) References Cited

U.S. PATENT DOCUMENTS 8,883,520 B2    11/2014    Satoh et al.
9,502,466 B1    11/2016    Chuang et al.
(Continued)

FOREIGN PATENT DOCUMENTS

JP    2004128229 A    4/2004
KR    20120009808    2/2012
(Continued)

OTHER PUBLICATIONS

Korean Intellectual Property Office, Korean Office Action dated Oct. 23, 2020, for Application No. 10-2019-0104731, filed Aug. 26, 2019, Applicant: Taiwan Semiconductor Manufacturing Company, Ltd., 5 pages.

*Primary Examiner* — David C Spalla
(74) *Attorney, Agent, or Firm* — HAYNES AND BOONE, LLP

(57) ABSTRACT

A method for etching a magnetic tunneling junction (MTJ) structure is described. A MTJ stack is deposited on a bottom electrode wherein the MTJ stack comprises at least a pinned layer, a barrier layer on the pinned layer, and a free layer on the barrier layer. A top electrode layer is deposited on the MTJ stack. A hard mask is deposited on the top electrode layer. The top electrode layer and hard mask are etched. Thereafter, the MTJ stack not covered by the hard mask is etched, stopping at or within the pinned layer. Thereafter, an encapsulation layer is deposited over the partially etched MTJ stack and etched away on horizontal surfaces leaving a self-aligned hard mask on sidewalls of the partially etched MTJ stack. Finally, the remaining MTJ stack not covered by (Continued)

hard mask and self-aligned hard mask is etched to complete the MTJ structure.

20 Claims, 2 Drawing Sheets

Related U.S. Application Data continuation of application No. 17/121,457, filed on Dec. 14, 2020, now Pat. No. 11,444,241, which is a continuation of application No. 16/113,079, filed on Aug. 27, 2018, now Pat. No. 10,868,237.

(51) Int. Cl.
*H01F 41/34* (2006.01)
*H10N 50/80* (2023.01)
*G11C 11/16* (2006.01)
*H10B 61/00* (2023.01)

(52) U.S. Cl.
CPC ............ *H10N 50/80* (2023.02); *G11C 11/161* (2013.01); *H10B 61/00* (2023.02)

(58) Field of Classification Search
CPC ...... H01F 10/3254; H01F 41/32; H01F 41/34; H10N 50/01; H10N 50/80; H10B 61/00; G11C 11/161
See application file for complete search history.

(56) References Cited

U.S. PATENT DOCUMENTS

| | | |
|---|---|---|
| 9,722,174 B1 | 8/2017 | Nagel et al. |
| 9,793,126 B2 | 10/2017 | Dhindsa et al. |
| 9,972,777 B1 | 5/2018 | Haq et al. |
| 11,818,961 B2* | 11/2023 | Yang ...................... H10N 50/10 |
| 2006/0261425 A1 | 11/2006 | Suemitsu et al. |
| 2012/0018826 A1 | 1/2012 | Lee et al. |
| 2013/0201757 A1 | 8/2013 | Li et al. |
| 2015/0061052 A1 | 3/2015 | Huang et al. |
| 2016/0225981 A1 | 8/2016 | Deshpande et al. |
| 2017/0062699 A1 | 3/2017 | Huang et al. |
| 2017/0125668 A1 | 5/2017 | Paranjpe et al. |
| 2017/0301857 A1 | 10/2017 | Mudivarthi et al. |
| 2018/0358547 A1 | 12/2018 | Yang et al. |
| 2019/0214554 A1 | 7/2019 | Li et al. |
| 2020/0066972 A1 | 2/2020 | Yang et al. |

FOREIGN PATENT DOCUMENTS

| | | |
|---|---|---|
| KR | 20180063183 A | 6/2018 |
| TW | 201742241 A | 12/2017 |

* cited by examiner

SELF-ALIGNED ENCAPSULATION HARD MASK TO SEPARATE PHYSICALLY UNDER-ETCHED MTJ CELLS TO REDUCE CONDUCTIVE RE-DEPOSITION

PRIORITY DATA

The present application is a continuation application of U.S. application Ser. No. 17/816,035, filed Jul. 29, 2022, which is a continuation application of U.S. application Ser. No. 17/121,457, filed Dec. 14, 2020, which is a continuation application of U.S. application Ser. No. 16/113,079, filed Aug. 27, 2018, each of which is herein incorporated by reference in its entirety.

TECHNICAL FIELD

This application relates to the general field of magnetic tunneling junctions (MTJ) and, more particularly, to etching methods for forming MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define the magnetic tunnel junctions (MTJ) in each MRAM device, precise patterning steps including photolithography and reactive ion etching (RIE), ion beam etching (IBE) or their combination are usually involved. During RIE, high energy ions remove materials vertically in those areas not masked by photoresist, separating one MTJ cell from another.

However, the high energy ions can also react with the non-removed materials, oxygen, moisture and other chemicals laterally, causing sidewall damage and lowering device performance. To solve this issue, pure physical etching techniques such as Ar RIE or ion beam etching (IBE) have been applied to etch the MTJ stack. However, due to the non-volatile nature, physically etched conductive materials in the MTJ and bottom electrode can form a continuous path across the tunnel barrier, resulting in shorted devices. A new approach to overcome this dilemma is thus needed if one wants to unleash the full potential of this physical etch to pattern the future sub 60 nm MRAM products.

Several references teach multi-step etching methods to form MTJ's, including U.S. Pat. No. 9,793,126 (Dhindsa et al), U.S. Pat. No. 9,722,174 (Nagel et al), and U.S. Pat. No. 8,883,520 (Satoh et al). All of these references are different from the present disclosure.

SUMMARY

It is an object of the present disclosure to provide an improved method of forming MTJ structures.

Yet another object of the present disclosure is to provide a method of forming MTJ devices using a physical under-etch to avoid both chemical damage and physical shorts.

A further object of the present disclosure is to provide a method of forming MTJ devices using a physical underetch to avoid both chemical damage and physical shorts where separate and non-interacting MTJ cells are made using encapsulation material as a self-aligned process.

In accordance with the objectives of the present disclosure, a method for etching a magnetic tunneling junction (MTJ) structure is achieved. A MTJ stack is deposited on a bottom electrode wherein the MTJ stack comprises at least a pinned layer, a barrier layer on the pinned layer, and a free layer on the barrier layer. A top electrode layer is deposited on the MTJ stack. A hard mask is deposited on the top electrode layer. The top electrode layer and hard mask are etched. Thereafter, the MTJ stack not covered by the hard mask is etched, stopping at or within the pinned or the seed layer. Thereafter, an encapsulation layer is deposited over the partially etched MTJ stack and etched away on horizontal surfaces leaving a self-aligned hard mask on sidewalls of the partially etched MTJ stack. Finally, the remaining MTJ stack not covered by hard mask and self-aligned hard mask is etched to complete the MTJ structure.

BRIEF DESCRIPTION OF THE DRAWINGS

In the accompanying drawings forming a material part of this description, there is shown.

DETAILED DESCRIPTION

In a typical process, the whole MTJ stack is patterned by a single step of etch, either by chemical RIE or physical Ar RIE or IBE. It therefore creates either chemical damage or physical shorts on the MTJ sidewall. In the process of the present disclosure, we first partially etch the MTJ stack to minimize the physical re-deposition. Then, using encapsulation material as a self-aligned hard mask, the remaining MTJ is etched. This new process avoids chemical damage and physical shorts simultaneously. Moreover, the second step of etch is a self-aligned process, meaning it does not require a complicated photolithography step, where the overlay is hard to control, especially for sub 60 nm MRAM devices.

In the process of the present disclosure, the MTJ stack is first partially etched by a physical etch such as RIE or IBE using different gas plasma such as Ar and Xe, so that there is no chemical damage but only conductive re-deposition on the sidewall. The amount of re-deposition is dependent on the etch amount. By intentionally under etching, e.g., only etching away the free layer, tunnel barrier and/or part of the pinned or the seed layer, the re-deposition on the tunnel barrier sidewall can be significantly reduced or totally removed. An encapsulation material is deposited to protect the earlier etched MTJ. A RIE or IBE etch partially clears out the portion of encapsulation material that is on top and bottom of the MTJ patterns. Next, using the encapsulation material left on the MTJ sidewalls as a self-aligned hard mask, the remaining MTJ is etched, creating separate and non-interacting MTJ cells. Regardless of what type of etch is used, the free layer and tunnel barrier layer would not be affected by this step due to the encapsulation material's protection, thus preserving high device performance.

Figure 1:
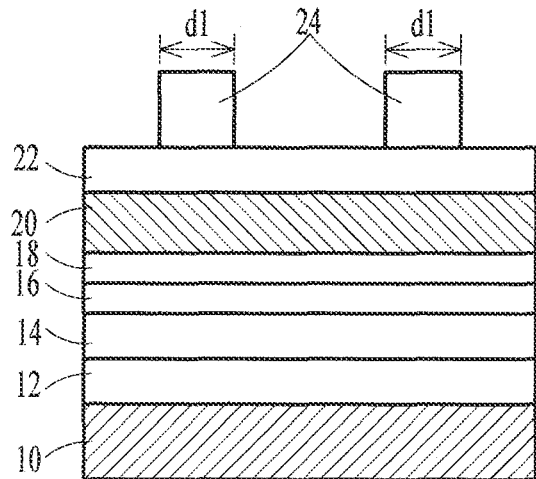
FIGS. 1 through 6 illustrate in cross-sectional representation steps in a preferred embodiment of the present disclosure.

Referring now to FIGS. 1 through 6, the novel method of the present disclosure will be described in detail. Referring now more particularly to FIG. 1, there is shown a bottom electrode 10 formed on a substrate, not shown. Now, layers are deposited on the bottom electrode to form a magnetic tunnel junction. For example, seed layer 12, pinned layer 14, tunnel barrier layer 16, and free layer 18 are deposited. There may be one or more pinned, barrier, and/or free layers. A metal hard mask 20, such as Ta, TaN, Ti, TiN, W, Cu, Mg, Ru, Cr, Co, Fe, Ni or their alloys, is deposited to a thickness of 10-100 nm, and preferably ≥50 nm, on top of the MTJ stack. This hard mask will be used as a top electrode. Finally, a dielectric hard mask material 22, such as $SiO_2$, SiN, SiON, SiC or SiCN, is deposited to a thickness of ≥20 nm onto the top electrode 20. Photoresist is patterned by 248 nm photolithography, for example, to form photoresist pillar patterns 24 with size d1 of ~70-80 nm and height 200 nm.

Figure 2:
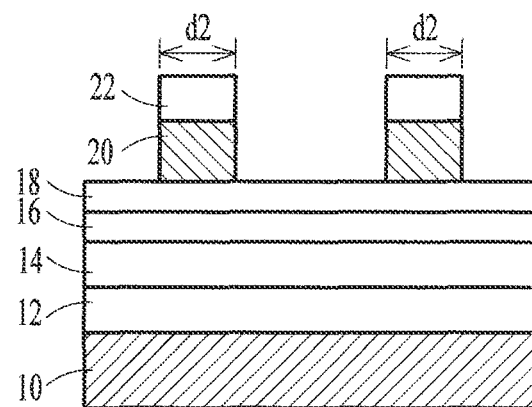

Now, as illustrated in FIG. 2, the dielectric and metal hard masks 22 and 20 are etched by a fluorine carbon based plasma such as $CF_4$ or $CHF_3$ alone, or mixed with Ar and $N_2$. $O_2$ can be added to reduce the pillar size d2 from 50-60 nm to 30-40 nm. They can also be etched by physical RIE or IBE (pure Ar), followed by large angle (70-90° with respect to the pillar's normal line) IBE trimming, forming pillar size d2 of 30-40 nm.

Figure 3:
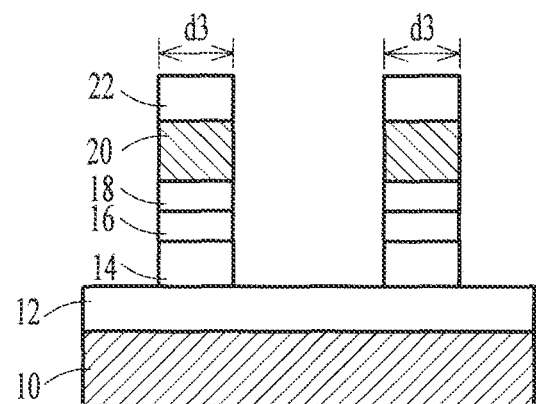

Referring now to FIG. 3, the MTJ stack is partially etched using physical RIE (pure Ar or Xe) or IBE stopping either on the pinned layer or the seed layer with similar pattern size, to minimize the metal re-deposition on the tunnel barrier. Because of the nature of a physical etch, there is no chemical damage. The height h of the partially etched MTJ stack is between about 5 and 30 nm.

Figure 4:
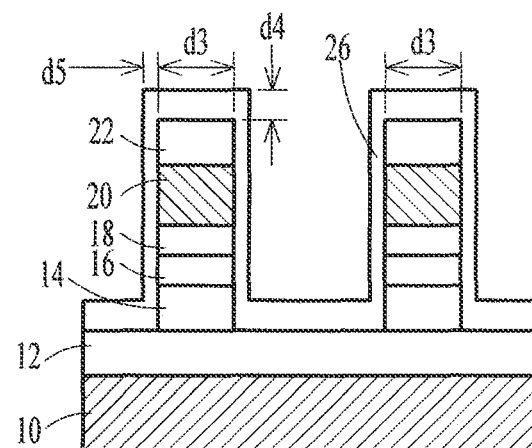
Figure 5:
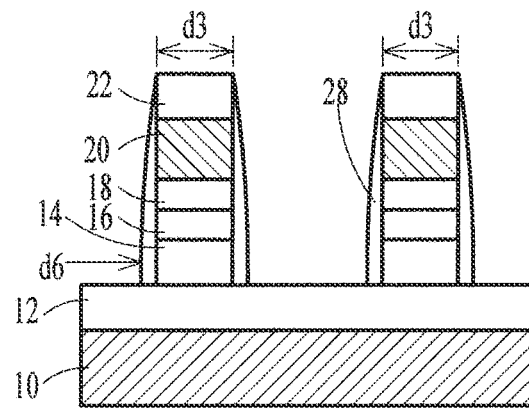

Now, as illustrated in FIG. 4, an encapsulation material 26 made of dielectric materials such as SiN, SiC, SiCN, carbon, or TaC or metal oxides such as $Al_2O_3$ or MgO with thickness d4 of 5-30 nm, is either in-situ or ex-situ deposited by CVD, PVD or ALD onto the partially etched MTJ patterns. The portion of the encapsulation material on top and bottom of the patterns is etched away by RIE or IBE, leaving encapsulation spacers 28 on the sidewalls, as shown in FIG. 5, having a thickness d6 of 10-30 nm. Depending on the material used for the spacer, different plasma can be used for this etching step. For example, a fluorine carbon based plasma such as $CF_4$ or $CHF_3$ can be used for SiN, SiC, and SiCN, $O_2$ can be applied for carbon, a fluorine carbon such as $CF_4$ or $CHF_3$ or a halogen such as $Cl_2$, or their combination, can be used for TaC, and a halogen such as $Cl_2$ alone or mixed with Ar can be used for $Al_2O_3$ and MgO.

Figure 6:
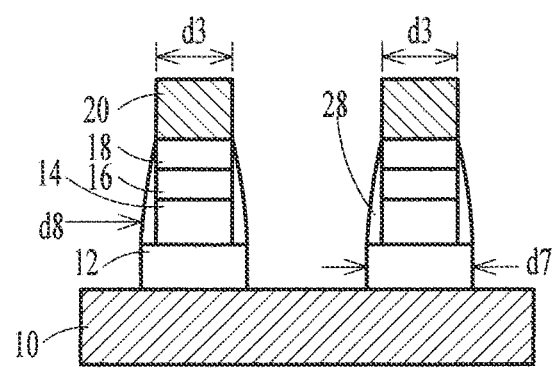

Finally using the encapsulation 28 left on the sidewalls of the MTJ patterns as a self-aligned hard mask, as shown in FIG. 6, the remaining MTJ stack such as the pinned layer 14 and/or seed layer 12 can be etched by RIE or IBE. When a RIE etch is used, since the pinned layer and seed layer fabricated by this method are larger than the free layer, the chemical damage on the pinned layer and seed layer would not affect its central portion which is aligned with the free layer. When physical RIE or IBE is used, the metal re-deposition from the pinned and seed layers would not be in contact with the tunnel barrier due to the encapsulation's protection. Note that this pinned and seed layer etch is a self-aligned step, meaning it has no overlay control issue, which is usually associated with sub 60 nm MRAM device fabrication.

More importantly, the pinned and seed layers' sizes are greatly dependent on the thickness of the encapsulation sidewall serving as the hard mask, which is determined by its initial deposition thickness and later etch conditions. By tuning these parameters, one can precisely control the pinned and seed layers' sizes according to the device design. For instance, one can create a thick spacer having a thickness d8 of 10-20 nm on the free layer's sidewall so that the later defined tunnel barrier and pinned layers are of the size d7 of 50-60 nm, larger than the free layer d3 of 40-50 nm. This is particularly critical for small cell size devices since it allows for strong pinning strength, increasing the energy barrier and reducing the switching current.

In summary, the process of the present disclosure uses a physical under etch to avoid both chemical damage and physical shorts. Moreover, separate and non-interacting MTJ cells are made using encapsulation material as a self-aligned process, meaning it has no overlay control issue, which is usually associated with sub 60 nm MRAM device fabrication. It is thus possible to replace the widely used chemical RIE etch, which inevitably brings chemical damage on the MTJ sidewall. This process will be used for MRAM chips of the size smaller than 60 nm as problems associated with chemically damaged sidewalls and re-deposition from the MTJ stack and bottom electrode become very severe for the smaller sized MRAM chips.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A magnetic tunneling junction (MTJ) device comprising:
   a stack of MTJ layers disposed on a first electrode, the stack of MTJ layers including a first layer having a first size and a second layer having a second size that is different than the first size, the first layer having a different material composition than the second layer;
   a dielectric spacer disposed along and physically contacting a sidewall of at least one of the first layer and the second layer; and
   a second electrode disposed over and having a bottom surface facing the first layer and the second layer, wherein the second electrode has a first sidewall and an opposing second sidewall and the bottom surface of the second electrode extending between the first and second sidewalls of the second electrode, wherein at least a portion of the first sidewall of the second electrode is free of the dielectric spacer.

2. The MTJ device of claim 1, wherein the first size is a first width and the second size is a second width that is different than the first width.

3. The MTJ device of claim 1, wherein the first size is a first thickness and the second size is a second thickness that is different than the first thickness.

4. The MTJ device of claim 1, wherein the first layer is a seed layer, and
   wherein the second layer is a barrier layer.

5. The MTJ device of claim 1, wherein the first layer is a pinner layer, and
   wherein the second layer is one of a barrier layer and a free layer.

6. The MTJ device of claim 1, wherein the dielectric spacer does not interface with the first electrode.

7. The MTJ device of claim 1, wherein the first layer has a top surface facing away from the first electrode, and
   wherein the dielectric spacer physically contacts the top surface of the first layer.

8. The MTJ device of claim 1, wherein the dielectric spacer disposed physically contacts respective sidewalls of the first layer and the second layer.

9. A magnetic tunneling junction (MTJ) device comprising:
   a first electrode;
   a stack of MTJ layers disposed on and interfacing with the first electrode, the stack of MTJ layers including:
      a first layer having a first width and a top surface facing away from the first electrode; and a second layer disposed on the first layer and having a second width that is different than the first width;

a dielectric spacer disposed along and interfacing with the second layer and the top surface of the first layer without extending to and interfacing with the first electrode;

a second electrode disposed on the second layer and having a bottom surface facing the first electrode, wherein the second electrode has a first sidewall and an opposing second sidewall and the bottom surface of the second electrode extending between the first and second sidewalls of the second electrode, wherein at least a portion of the first sidewall of the second electrode is free of the dielectric spacer.

10. The MTJ device of claim 9, wherein the dielectric spacer extends laterally away from the second layer over the top surface of the first layer without extending beyond a sidewall of the first layer, and
wherein the sidewall of the first layer is free of the dielectric spacer.

11. The MTJ device of claim 9, wherein the dielectric spacer increases in width towards the top surface of the first layer.

12. The MTJ device of claim 9, wherein the first layer is a seed layer and the second layer is pinned layer,
wherein the stack of MTJ layers further includes a tunnel barrier layer disposed on the pinned layer and a free layer disposed on the tunnel barrier layer, and
wherein the dielectric spacer physically contacts the tunnel barrier layer and the free layer.

13. The MTJ device of claim 9, wherein the dielectric spacer includes a nitrogen containing material.

14. The MTJ device of claim 9, wherein the dielectric spacer includes a carbon containing material.

15. The MTJ device of claim 9, wherein the dielectric spacer includes a metal oxide material.

16. A method comprising:
providing a stack of magnetic tunneling junction (MTJ) layers having a first electrode layer disposed over and interfacing with a first layer from the stack of MTJ layers;
forming a dielectric layer directly on a sidewall of the first electrode layer and directly on a sidewall of the first layer from the stack of MTJ layers;
removing portions of the dielectric layer to form a dielectric spacer disposed along the sidewall of the first layer from the stack of MTJ layers, wherein the sidewall of the first electrode layer is exposed after the removing of the portions of the dielectric layer to form the dielectric spacer disposed along the sidewall of the first layer from the stack of MTJ layers.

17. The method of claim 16, wherein the stack of MTJ layers is disposed on and interfacing with a second electrode layer, and
wherein the first electrode layer has a top surface facing away from the second electrode layer, and
wherein the forming of the dielectric layer directly on the sidewall of the first electrode layer and directly on the sidewall of the first layer from the stack of MTJ layers includes forming the dielectric layer directly on the top surface of the first electrode layer such that the dielectric layer interfaces with and covers the top surface of the first electrode layer.

18. The method of claim 17, wherein the removing of the portions of the dielectric layer to form the dielectric spacer disposed along the sidewall of the first layer from the stack of MTJ layers includes performing a first removal process to remove a first portion of the dielectric layer from over the top surface of the first electrode layer, wherein the top surface of the first electrode layer is exposed while the sidewall of the first electrode layer is still covered by the dielectric layer after the performing of the first removal process.

19. The method of claim 18, wherein the removing of the portions of the dielectric layer to form the dielectric spacer disposed along the sidewall of the first layer from the stack of MTJ layers includes performing a second removal process to remove a second portion of the dielectric layer from along the sidewall of the first electrode layer, wherein the top surface and the sidewall surface of the first electrode layer are exposed after the performing of the second removal process.

20. The method of claim 19, wherein the first removal process is different from the second removal process, and
wherein the first removal process includes using one of a first reactive ion etching process and a first ion beam etching process, and
wherein the second removal process includes using one of a second reactive ion etching process and a second ion beam etching process.

* * * * *